United States Patent
Satoh

(10) Patent No.: US 7,088,192 B2
(45) Date of Patent: Aug. 8, 2006

(54) INVERTER OSCILLATOR CIRCUIT

(75) Inventor: Tomio Satoh, Kouza-gun (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 10 days.

(21) Appl. No.: 10/802,628

(22) Filed: Mar. 17, 2004

(65) Prior Publication Data

US 2004/0189413 A1    Sep. 30, 2004

(51) Int. Cl.
   *H03B 5/36*        (2006.01)

(52) U.S. Cl. .................... 331/116 R; 331/158

(58) Field of Classification Search ............ 331/116 R, 331/117 R, 158

See application file for complete search history.

(56) References Cited

U.S. PATENT DOCUMENTS 6,294,964 B1 * 9/2001 Satoh ................. 331/116 R
6,507,248 B1 * 1/2003 Nakamura ............. 331/158
2002/0024397 A1 * 2/2002 Fujii et al. ............ 331/116 R

* cited by examiner

*Primary Examiner*—Joseph Chang
(74) *Attorney, Agent, or Firm*—Koda & Androlia

(57) ABSTRACT

In an inverter oscillation circuit an output terminal 2 of an inverter 1 with its input and output interconnected via a high resistance R1 is grounded via a series connection of a capacitor C1 and parallel tuning circuit composed of a capacitor C2 and an inductor L1 connected in parallel, and the connection point of this series connection is grounded via a parallel circuit of diodes D1 and D2 connected in opposite polarities. The connection point of the series connection is connected to an input terminal 3 of the inverter 1 via series-connected capacitors C3 and C4, and the connection point of this series connection is grounded via a piezoelectric vibrator Xtal and a frequency adjusting capacitor C7. The inverter oscillation circuit is configured to provide its output via a series circuit composed of a resistor R2 and a capacitor C6.

4 Claims, 6 Drawing Sheets

PRIOR ART

INVERTER OSCILLATOR CIRCUIT

FIELD OF THE INVENTION

The present invention relates to a piezoelectric oscillator and, more particularly, to a piezoelectric oscillator configured to reduce power requirements and enlarge the range of frequency adjustment.

BACKGROUND OF THE INVENTION

In recent years the mobile communication equipment, such as portable telephones and portable information terminal equipment, has come into widespread use. An oscillation circuit built in a semiconductor integrated circuit for the mobile communication is such an inverter oscillation circuit as disclosed in Japanese Patent Kokai Publication No. 2000-299612. FIG. 6 shows, by way of example, a conventional inverter oscillation circuit. In the illustrated circuit, an output terminal 11 of a signal inverting amplifier 10 with its input and output interconnected via a high resistance R11 is grounded via a capacitor C11 and is connected via a piezoelectric vibrator Xtal and a frequency adjusting capacitor C14 to an input terminal 12 of the signal inverting amplifier 10, and the input terminal 12 is grounded via a capacitor C12. The output signal from the circuit is provided via a series circuit of a resistor R12 and a capacitor C13. The piezoelectric oscillator usually employs a CMOS inverter that has enough driving ability to start piezoelectric oscillation in a short time. On this account, although the piezoelectric oscillation circuit does not inherently require such high driving power for its steady-state oscillation after being started, the operation of the CMOS inverter of high driving power inevitably causes unnecessary power consumption, giving rise to the problem of shortened battery life of the mobile communication equipment. Moreover, the use of the CMOS inverter excites the piezoelectric element strongly more than required during the stead-state oscillation and hence produces therein great mechanical stress—this may sometimes constitute an obstacle to achieving excellent aging characteristics of the piezoelectric oscillator.

Further, the conventional circuit has the piezoelectric vibrator Xtal and the frequency adjusting capacitor C14 inserted between the input and output of the signal inverting amplifier 10 for oscillation; the circuit oscillates in the vicinity of the resonance point of the piezoelectric vibrator Xtal by setting the gain of the signal inverting amplifier 10 at a large value and increasing the impedance between its input and output. That is, because of a small load capacitance across the piezoelectric vibrator Xtal, the conventional circuit may, in some cases, encounter the problem of incapability of adjusting frequency over a wide range in response to variations in the capacitance value of the capacitor C14.

SUMMARY OF THE INVENTION

According to an aspect of the present invention, there is provided a piezoelectric oscillator which comprises a piezoelectric vibrator provided with a piezoelectric element for excitation at a predetermined frequency, and a signal inverting amplifier for supplying current to the piezoelectric element to excite it, and in which an output terminal of the signal inverting amplifier having its input and output interconnected via a high resistance is grounded via a series connection of a capacitance and a parallel tuning circuit, the connection point of the capacitance and the parallel tuning circuit is grounded via a diode clamping circuit and is connected to an input terminal of the signal inverting amplifier via two series-connected two capacitances, and the connection point of the two series-connected capacitances is grounded via the piezoelectric vibrator and a frequency adjusting element.

According to another aspect of the present invention, there is provided a piezoelectric oscillator which comprises a piezoelectric vibrator provided with a piezoelectric element for excitation at a predetermined frequency, and a signal inverting amplifier for supplying current to the piezoelectric element to excite it, and in which an output terminal of the signal inverting amplifier is grounded via a series connection of a capacitance and a parallel tuning circuit, the connection point of the capacitance and the parallel tuning circuit is connected to an input terminal of the signal inverting amplifier via a series connection of two capacitances, and the connection point of the two series-connected capacitances is grounded via the piezoelectric vibrator and a frequency adjusting element.

According to another aspect of the present invention, the diode clamping circuit is formed by a parallel circuit of two diodes connected in opposite polarities.

According to another aspect of the present invention, as viewed from the connection point of the two series-connected capacitances, one of the two capacitances and the parallel tuning circuit constitute a series resonance circuit.

According to still another aspect of the present invention, the piezoelectric vibrator is a crystal vibrator.

DESCRIPTION OF THE PREFERRED EMBODIMENTS

A detailed description will be given, with reference to the accompanying drawings, of embodiments of the present invention. It is to be understood that the constituent features, their kinds, combinations, configurations and relative arrangement described in connection with the embodiments are not intended to be limiting the present invention specifically thereto unless otherwise specified but are merely illustrative of the invention. While the embodiments will be described to use a crystal oscillator as the piezoelectric oscillator (vibrator), the present invention is applicable to other piezoelectric oscillators as well.

Figure 1:
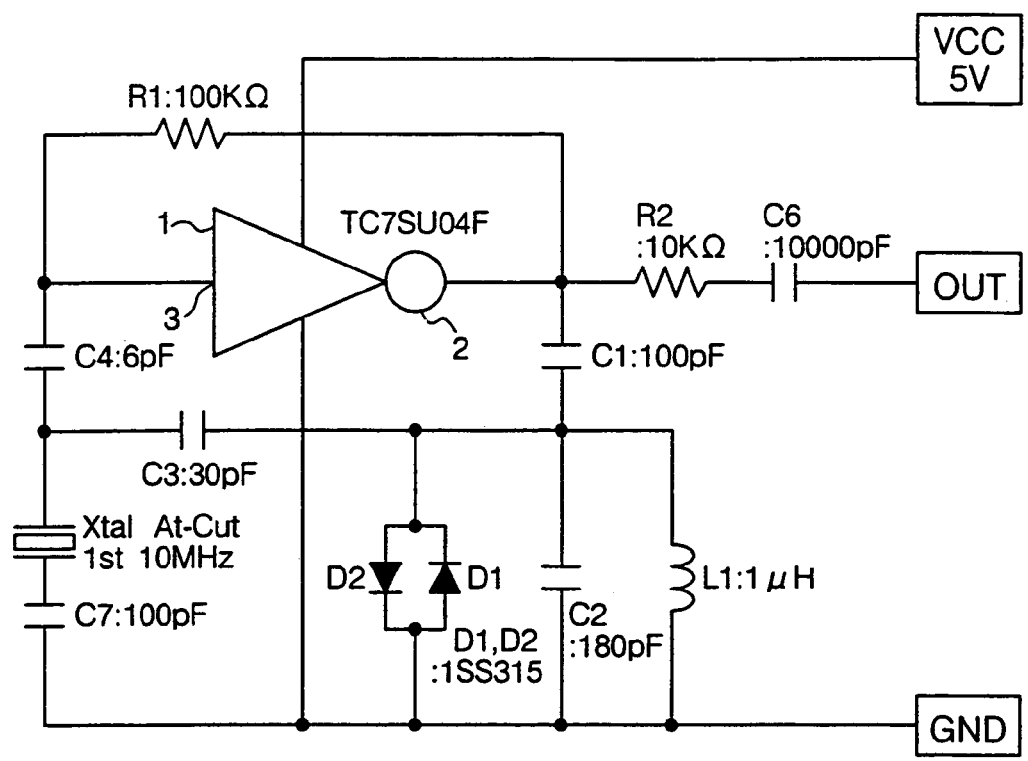
FIG. 1 is a circuit diagram of an inverter oscillation circuit equipped with a clamping circuit according to an embodiment of the present invention.

FIG. 1 is a circuit diagram of an inverter oscillation circuit equipped with a clamping circuit according to a first embodiment of the present invention. Incidentally, the numerical values attached to reference numerals indicating respective circuit elements are their concrete values used, as design conditions, to obtain the electrical characteristics of the oscillator described later on. In the illustrated inverter oscillation circuit an output terminal 2 of an inverter 1 having its input and output interconnected via a high resistance R1 is grounded via a series connection of a capacitor C1 and a parallel tuning circuit formed by a capacitor C2 and an inductor L1 connected in parallel, and the connection point of the series-connected capacitor C2 and inductor L1 is grounded via a parallel circuit of diodes D1 and D2 connected in opposite polarities. The connection point of the above-mentioned series connection is connected to an input terminal 3 of the inverter 1 via a series connection of capacitors C3 and C4, and the connection point of the series-connected capacitors C3 and C4 is grounded via a piezoelectric vibrator Xtal and a frequency adjusting capacitor C7. Incidentally, this circuit is configured to provide its output via a series connection of a resistor R2 and a capacitor C6.

Next, the operation of this embodiment will be described, but since the oscillating operation is well-known in the art, no detailed description will be given thereof. Upon connection of a power supply VCC 5V to the inverter 1, the circuit begins oscillation according to the natural oscillation frequency of the piezoelectric element Xtal, generating a high-level voltage at the output terminal 2 of the inverter 1. The AC component of the voltage is input via the capacitor C1 to the parallel tuning circuit of the capacitor C2 and the inductor L1, and the clamping diodes D1 and D2. When the voltage is positive, the diode D2 conducts, whereas when the voltage is negative, the diode D1 conducts; and based on diode characteristics, the forward voltage of each diode does not exceed a predetermined value (about 0.7 V). Accordingly, when a feedback signal from the output terminal 2 of the inverter 1 to the piezoelectric element Xtal goes up above a certain excitation level, the diodes D1 and D2 both conduct, preventing the excitation level from exceeding ±0.7 Vp-p. As a result, the impedance between the input and output of the inverter 1 sharply drops and consequently the oscillation gain also sharply decreases, thereby significantly suppressing the current flow to the piezoelectric element Xtal.

Incidentally, respective constants of the oscillation circuit in this embodiment are as follows:

R1: 100 kΩ, R2: 10 kΩ, C1: 100 pF, c2: 180 pF, C3: 30 pF, C4: 6 pF, C6: 10000 pF, C7: 100 pF, L1: 1 μF, D1, D2: 1SS315; Xtal: At-cut 1st 10 MHz, inverter 1: TC7SU04F.

Figure 2:
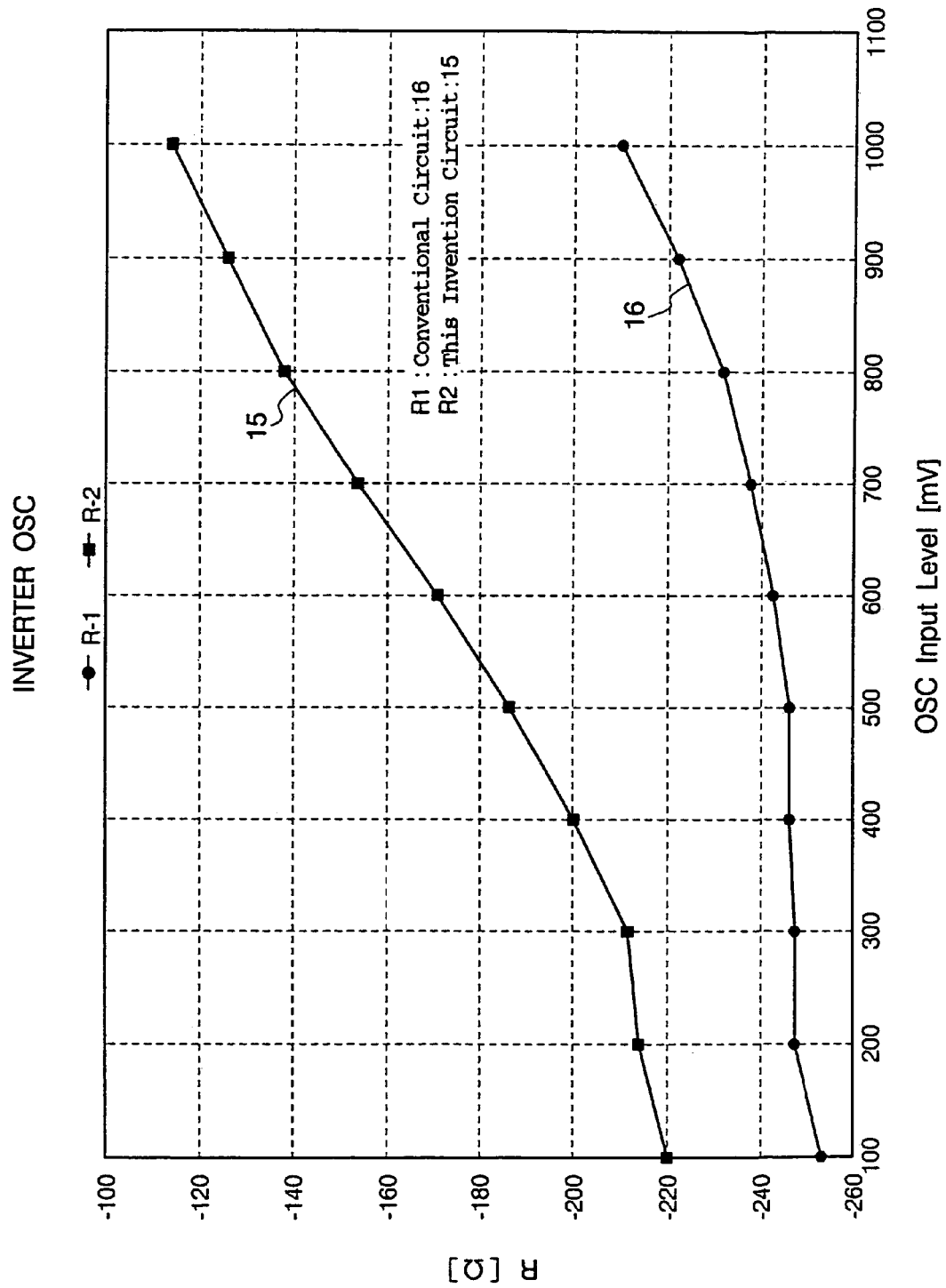
FIG. 2 is a graph showing the relationship between the negative resistance value and the oscillator input level of the inverter oscillation circuit of the FIG. 1 embodiment.

FIG. 2 is a graph showing the relationship between the negative resistance value and the oscillator input level in the FIG. 1 inverter oscillation circuit equipped with a clamping circuit. The abscissa represents the input level (in mV) of the oscillator (the inverter oscillation circuit), and the ordinate represents the negative resistance (in Ω). Reference numeral 15 indicates the characteristics of this invention circuit, and 16 the characteristics of a conventional circuit. As is evident from FIG. 2, in the conventional circuit the negative resistance generally remains constant at large values and is not greatly affected by the oscillator input level. In contrast thereto, in the circuit of the present invention when the oscillator input level goes beyond 300 mV, the negative resistance decreases, suppressing the vibrator current. That is, according to the present invention, the amplitude suppression by the clamping circuit sharply decreases the negative resistance to thereby suppress the vibrator current.

As described above, the present invention features the insertion of the vibrator between the input of the inverter oscillation circuit and the ground. The above-described configurations of the clamping circuit and the inverter oscillation circuit should not be construed as limiting the present invention specifically thereto but are merely illustrative of the invention.

Figure 3:
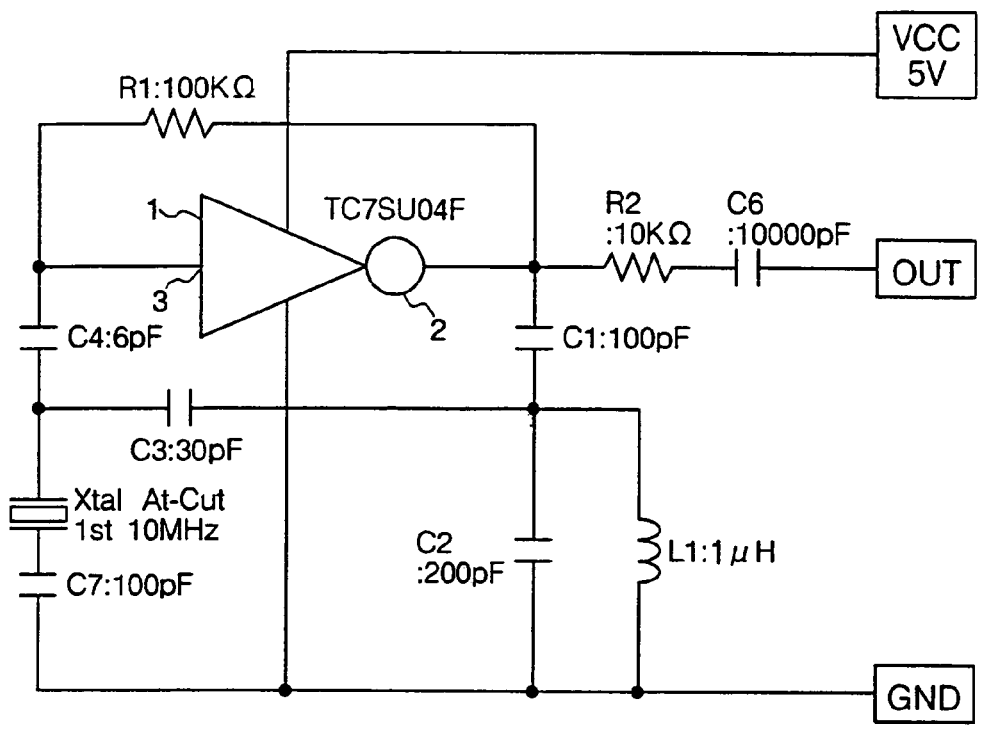
FIG. 3 is a circuit diagram of an inverter oscillation circuit according to a second embodiment of the present invention.

FIG. 3 is a circuit diagram of an inverter oscillation circuit according to a second embodiment of the present invention. Incidentally, the numerical values attached to reference numerals indicating respective circuit elements are their concrete values used, as design conditions, to obtain the electrical characteristics of the oscillator described later on. In the illustrated inverter oscillation circuit, the output terminal 2 of the inverter 1 with its input and output interconnected via the high resistance R1 is grounded via the series circuit composed of the capacitor C1 and the parallel tuning circuit composed of the capacitor C2 and the inductor L1, and the connection point of this series circuit is connected to the input terminal 3 of the inverter 1 via the capacitors C3 and C4, and the connection point of series-connected capacitors C3 and C4 is grounded via the piezoelectric vibrator Xtal and the frequency adjusting capacitor C7. Incidentally, this circuit is configured to provide its output via the series circuit of the resistor R2 and the capacitor C6.

Next, the operation of this embodiment will be described, but since the oscillating operation is well-known in the art, no detailed description will be given thereof. Upon connection of a power supply VCC 5V to the inverter 1, the circuit begins oscillation according to the natural oscillation frequency of the piezoelectric element Xtal, generating a high-level voltage at the output terminal 2 of the inverter 1. Since the condition for oscillation is determined by a reactance circuit composed of the capacitor C1 and the above-mentioned parallel tuning circuit, the load capacitance can be set at a large value by setting the values of the capacitor C2 and the inductor L1 such that the parallel tuning circuit generates an inductance component, for example, in the vicinity of n oscillation frequency of 10 MHz.

The constants of the oscillation circuit of this embodiment are as follows: Xtal: At-cut 1st 10 MHz, C2=200 pF, and L1=1 μH.

Figure 4:
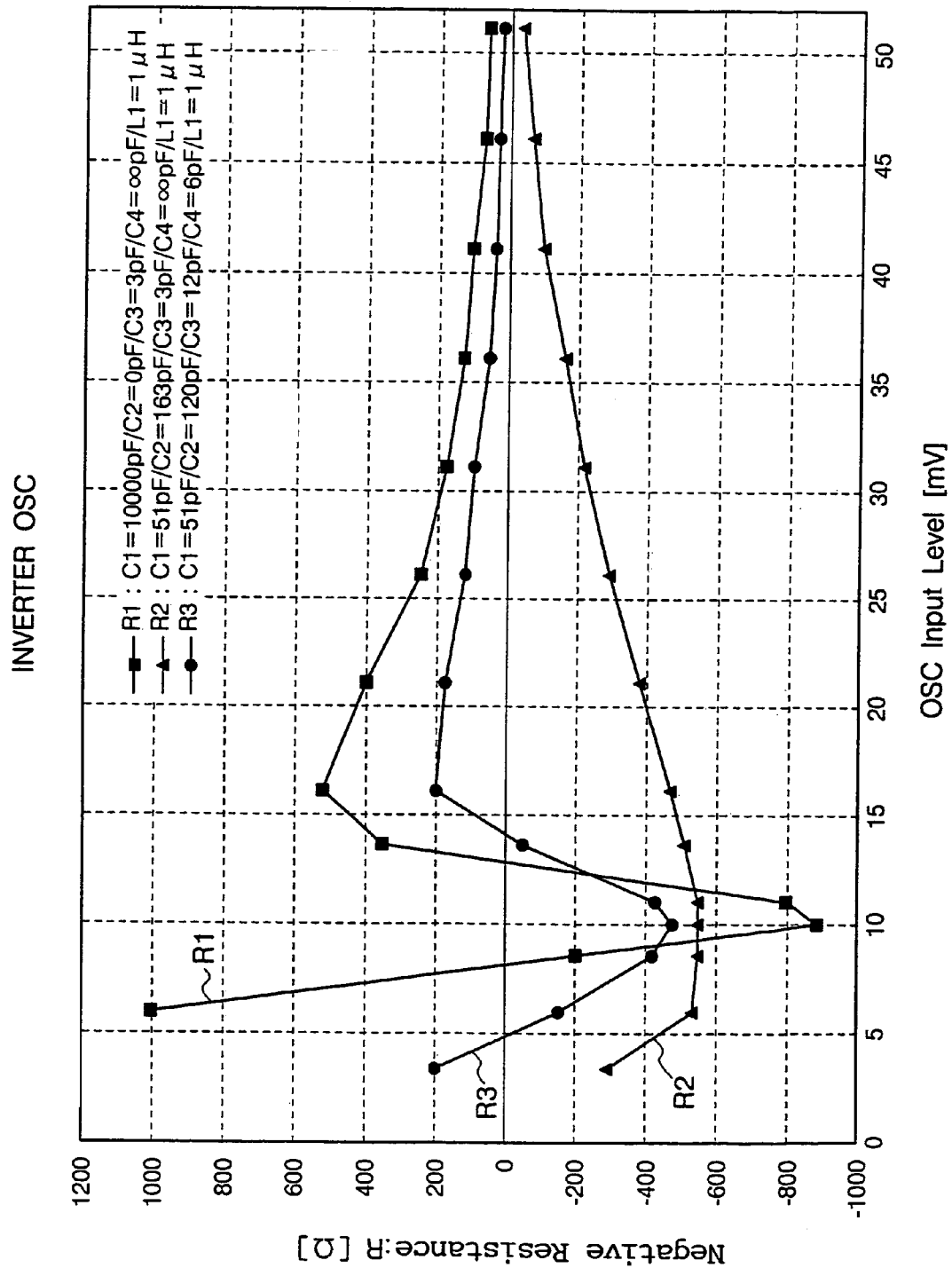
FIG. 4 is a graph showing the relationship between the negative resistance value and the oscillator input level of the inverter oscillation circuit of the FIG. 3 embodiment when respective constants of the oscillation circuit were changed.

FIG. 4 is a graph showing the relationship between the negative resistance and the oscillator input level, obtained with various values of the respective constants of the inverter oscillation circuit depicted in FIG. 3. The abscissa represents the oscillator input level (in mV) and the ordinates the negative resistance (in Ω). The constants for the respective characteristics indicated by R1, R2 and R3 are as follows:

R1: C1=51 pF, C2=163 pF, C3=3 pF, C4=∞ pF, L1=1 μH
R2: C1=10000 pF, C2=0 pF, C3=3 pF, C4=∞ pF, L1=1 μH
R3: C1=51 pF, C2=120 pF, C3=12 pF, C4=6 pF, L1=1 μH

As will be seen from FIG. 4, in the case of R1, the negative resistance for an oscillator input level of 10 mV is the highest, that is, a maximum of −900 Ω in the case of R1, the second highest is about −600 Ω in the case of R2, and the lowest negative resistance is −500 Ω in the case of R3. This indicates how easily the inverter oscillation circuit of this embodiment starts to oscillate strongly. In particular, the condition for easy oscillation could be obtained by adjusting the value of the resistor R1.

Figure 5:
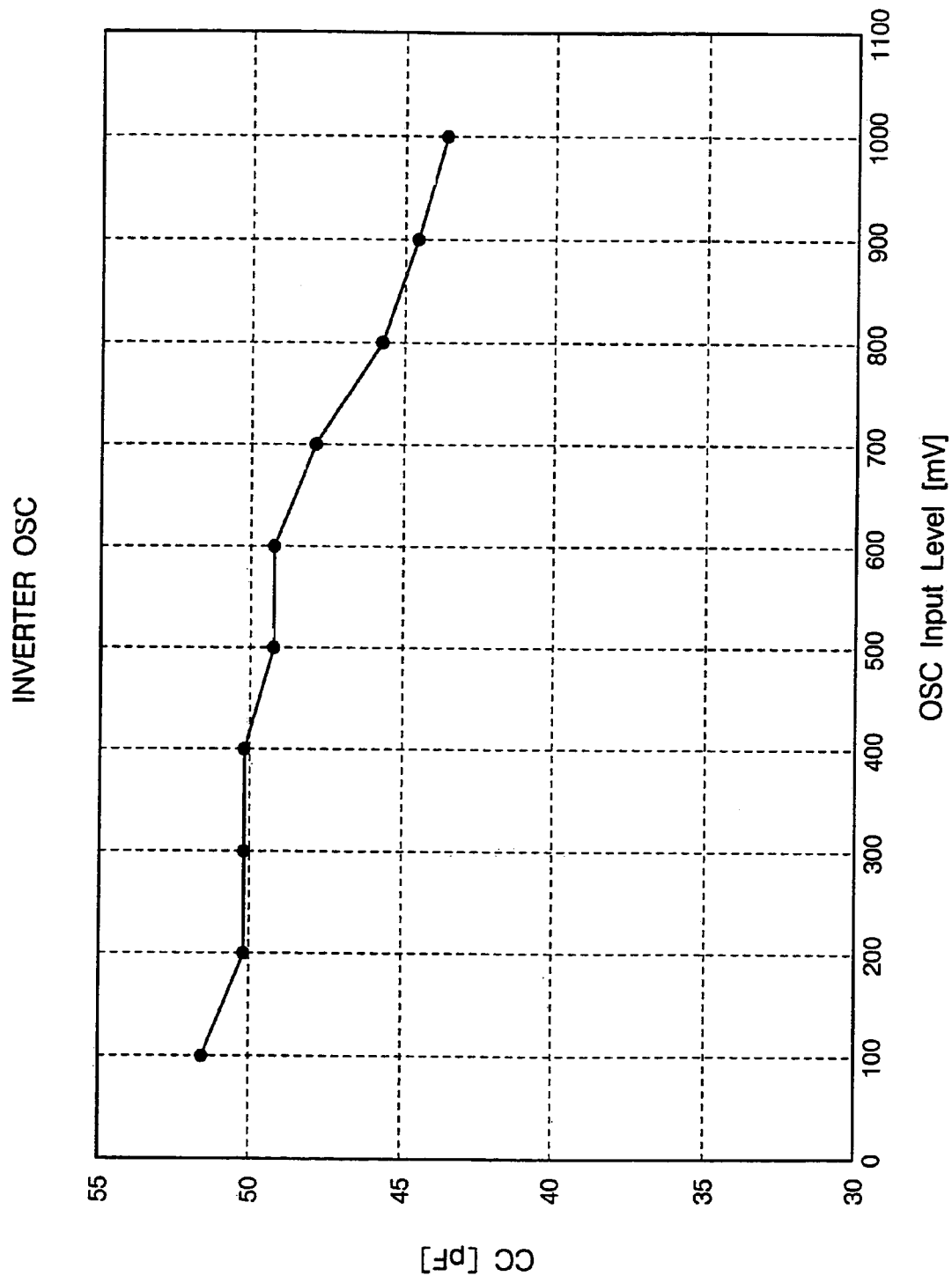
FIG. 5 is a graph showing the relationship between the circuit capacitance and the oscillator input level obtained with the circuit constants given in the FIG. 3 embodiment.
Figure 6:
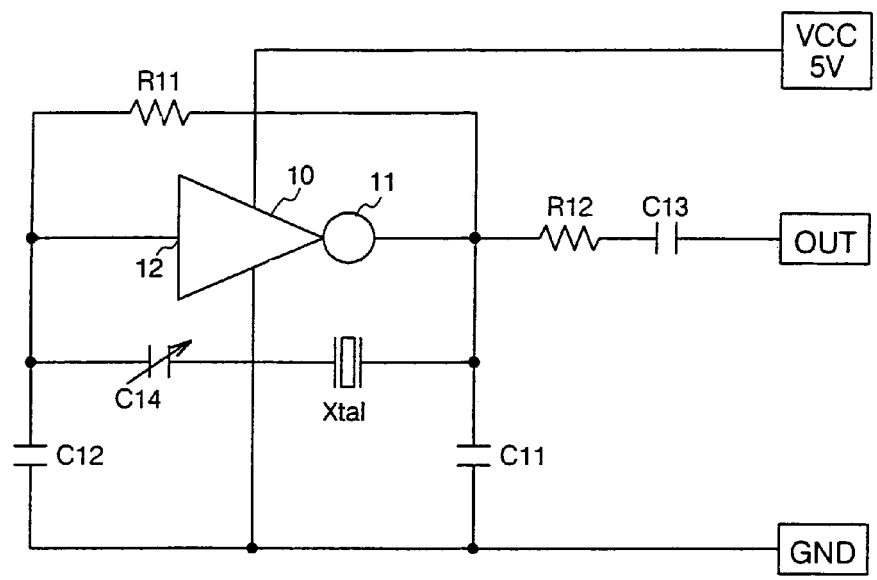
FIG. 6 is a circuit diagram of a conventional inverter oscillation circuit.

FIG. 5 is a graph showing the relationship between the circuit capacitance and the oscillator input level in the case of using the circuit constant in the case of FIG. 3. The abscissa represents the oscillator input level (in mV) and the ordinate the circuit capacitance (in pF). As is evident from FIG. 5, the circuit capacitance gradually decreases with changes in the oscillator input level but remains at high levels. This means that the load capacitance can be increased by setting the circuit constant to a value close to that of the series resonance circuit, making it possible to obtain a sufficient negative resistance for oscillation.

As described above, the present invention features the insertion of the vibrator between the input of the inverter oscillation circuit and the ground. The present invention is not limited specifically to the above-described configuration of the inverter oscillation circuit and is applicable to other circuit configurations as well.

What is claimed is:

1. A piezoelectric oscillator which comprises a piezoelectric vibrator provided with a piezoelectric element for excitation at a predetermined frequency, and a signal inverting amplifier for supplying current to the piezoelectric element to excite it, characterized in that:

an output terminal of the signal inverting amplifier having its input and output interconnected via a high resistance is grounded via a series connection of a capacitance and a parallel tuning circuit; the connection point of the capacitance and the parallel tuning circuit is grounded via a diode clamping circuit and is connected to an input terminal of the signal inverting amplifier via two series-connected capacitances; and the connection point of the two series-connected capacitances is grounded via the piezoelectric vibrator and a frequency adjusting element.

2. The piezoelectric oscillator of claim 1, characterized in that the diode clamping circuit is formed by a parallel circuit of two diodes connected in opposite polarities.

3. The piezoelectric oscillator of claim 1, characterized in that, as viewed from the connection point of the two series-connected capacitances, one of the two capacitances and the parallel tuning circuit constitute a series resonance circuit.

4. The piezoelectric oscillator of claim 1, characterized in that the piezoelectric vibrator is a crystal vibrator.

* * * * *

UNITED STATES PATENT AND TRADEMARK OFFICE
CERTIFICATE OF CORRECTION

PATENT NO. : 7,088,192 B2 Page 1 of 1
APPLICATION NO. : 10/802628
DATED : August 8, 2006
INVENTOR(S) : Tomio Satoh It is certified that error appears in the above-identified patent and that said Letters Patent is hereby corrected as shown below:

Title page,
Add Item [30] as follows:

-- [30] Foreign Application Priority Data:
   Mar. 31, 2003 (JP) .......... 2003-097418
   Mar. 31, 2003 (JP) .......... 2003-097419 --

Signed and Sealed this

Twenty-first Day of April, 2009

JOHN DOLL
*Acting Director of the United States Patent and Trademark Office*